United States Patent
Tabatabai et al.

[19]

[11] Patent Number: 5,892,376
[45] Date of Patent: Apr. 6, 1999

[54] HIGH-SPEED/HIGH-SLEW-RATE TRI-MODAL ALL BIPOLAR BUFFER/SWITCH AND METHOD THEREOF

[75] Inventors: Ali Tabatabai, Stanford; Ali Fotowat-Ahmady, San Rafael; Nasrollah Saeed Navid, Saratoga, all of Calif.

[73] Assignee: Philips Electronics North America Corporation, New York, N.Y.

[21] Appl. No.: 916,724

[22] Filed: Aug. 18, 1997

Related U.S. Application Data

[63] Continuation of Ser. No. 539,921, Oct. 6, 1995, abandoned.

[51] Int. Cl.$^6$ .................................................. H03K 5/153
[52] U.S. Cl. .............................. 327/73; 327/170; 327/323; 327/540; 327/561; 330/136
[58] Field of Search .............................. 327/54, 73, 87, 327/323, 545, 540, 561, 563, 134, 170; 365/229; 330/129, 136

[56] References Cited

U.S. PATENT DOCUMENTS

| | | | |
|---|---|---|---|
| 5,175,451 | 12/1992 | Ihara | 327/54 |
| 5,194,824 | 3/1993 | Wu et al. | 330/255 |
| 5,343,084 | 8/1994 | Gens | 327/73 |
| 5,471,169 | 11/1995 | Dendinger | 327/563 |
| 5,539,353 | 7/1996 | Kajimoto et al. | 327/323 |

*Primary Examiner*—Timothy P. Callahan
*Assistant Examiner*—Jung Ho Kim
*Attorney, Agent, or Firm*—Brian J. Wieghaus

[57] ABSTRACT

A high-speed/high-slew-rate tri-modal all bipolar buffer/switch includes a unity-gain amplifier, a voltage source, and a maximum level detector and a minimum level detector adjusting a current source to sink or source current as required to quickly make the output voltage of the switch equal to the input voltage of the switch. The maximum level detector and the minimum level detector compare the output voltage to the input voltage. If the output voltage does not equal the input voltage, the current source acts as either a sink or source to make the output voltage equal the input voltage. In addition, the voltage switch holds a constant d.c. voltage at the output of the switch when the switch is powered down.

7 Claims, 3 Drawing Sheets

HIGH-SPEED/HIGH-SLEW-RATE TRI-MODAL ALL BIPOLAR BUFFER/SWITCH AND METHOD THEREOF

This is a continuation of application Ser. No. 08/539,921, filed Oct. 6, 1995 now abandoned.

BACKGROUND OF THE INVENTION

1. Field of the Invention

The present invention is related to bipolar switches, and specifically, to tri-modal bipolar switches.

2. Description of the Related Art

In an ideal switch, when the switch is closed, the same signal appearing at the input of the switch instantaneously appears at the output of the switch. Related art methods for implementing switches are shown in FIGS. 1(A), 1(B), and 1(C), explained herein below.

FIG. 1(A) shows a CMOS dual device switch 1. The CMOS dual device switch 1 is the closest switch to an ideal switch of the switches shown in FIGS. 1(A)–1(C). The CMOS dual device switch 1 acts like a passive switch, with the output drive capability thereof limited by stages which precede the switch 1.

A second method of implementing a switch is a diode bridge switch 2, shown in FIG. 1(B). The diode bridge switch 2 is opened when currents $I_1$ and $I_2$ are both turned off. A problem with the diode bridge switch 2, however, is that for proper distortion free operation, the sink or source current for a load should be much less than the current values of either $I_1$ or $I_2$. Therefore, during continuous operation of the diode bridge switch 2, current is wasted.

A third method of implementing a switch is a unity gain connected operational amplifier (op-amp) 3 with power down capability, shown in FIG. 1(C). A drawback, though, of the unity gain connected op-amp 3 is that trade-offs must be made between having low standby current, high current drive capability, and capacitive compensation requirements.

In switches of the related art, when an a.c. load is provided at the input of the switch and the switch is closed, the output voltage does not instantaneously equal the input voltage. If the output voltage is less than the input voltage, in the related art, a high amount of current is needed to be provided to the load to increase the output voltage to make the output voltage equal the input voltage.

Tri-modal buffer/switches implemented in CMOS or bi-CMOS are easy to realize because MOS devices act as very good switches. A typical MOS device provides a small resistance when the MOS device is turned on. Further, when the MOS device is turned off, a very small amount of leakage current is output by the MOS device. If MOS switches are used, the MOS switches should be preceded by an MOS or a bipolar buffer, for current drive capability. However, a bi-CMOS switch is more expensive to implement than is a bipolar switch. Further, a bipolar switch has a faster switching speed than does a CMOS switch.

What is needed is a high-speed/high-slew-rate tri-modal buffer/switch implemented using all bipolar devices.

SUMMARY OF THE INVENTION

An object of the present invention is to implement a high-speed/high-slew-rate tri-modal all bipolar buffer/switch which can source or sink several milli-amperes of current on demand when the switch is closed.

Another object of the present invention is to provide a low voltage drop across the switch when the switch is closed.

A further object of the present invention is to provide a switch which, when opened, provides high impedance at the output, and draws almost no current from a load on the switch.

An additional object of the present invention is to provide a switch which has a power-down mode in which the switch draws less than thirty micro-amperes of current and provides a reference voltage at the output of the switch to prevent capacitive loads on the switch from discharging.

Also an object of the present invention is to approach an ideal switch, which maintains a zero voltage drop across the switch when the switch is closed, and instantaneously brings the output voltage equal to the input voltage when the switch is closed.

The above objects can be attained by the present invention which provides the capability of realizing a near-ideal switch. The present invention is a tri-modal buffer/switch which can source or sink several milli-amperes of current on demand when the switch is closed. In addition, the bipolar buffer/switch of the present invention is implemented using bipolar semiconductor devices. Further, the bipolar buffer/switch of the present invention provides relatively high impedance between the input node and the output node of the switch when the switch is open, and provides a very small voltage drop across the switch when the switch is closed. In addition, the bipolar buffer/switch of the present invention draws almost no current away from a load when the switch is opened. Further, in the bipolar buffer/switch of the present invention, when the bipolar buffer/switch is powered-down, a constant d.c. voltage is provided at the output of the switch to keep an a.c. capacitive load charged up, so that when the switch is turned on, the switch is immediately returned to the state of the switch when the switch was turned off, thereby preventing the a.c. capacitive load from discharging. In addition, the bipolar buffer/switch of the present invention draws less than thirty micro-amperes of current in the power-down mode.

These together with other objects and advantages which will be subsequently apparent, reside in the details of construction and operation is more fully hereinafter described in claim, the reference being had to the accompanying drawings forming a part hereof, wherein like numerals refer to like parts throughout.

BRIEF DESCRIPTION OF THE DRAWINGS

Further details of the present invention are explained below, with the aid of the attached drawings in which.

DESCRIPTION OF THE PREFERRED EMBODIMENTS

Figure 1A:
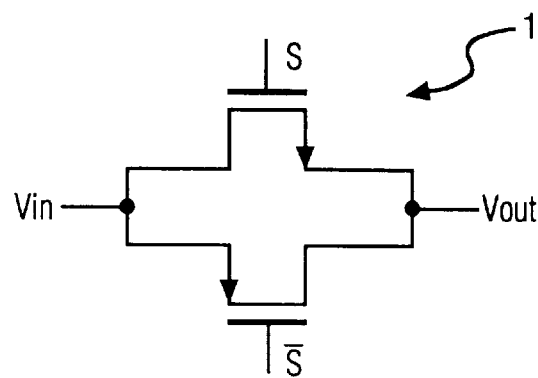
FIGS. 1(A), 1(B), and 1(C) show switches of the related art.
Figure 1B:
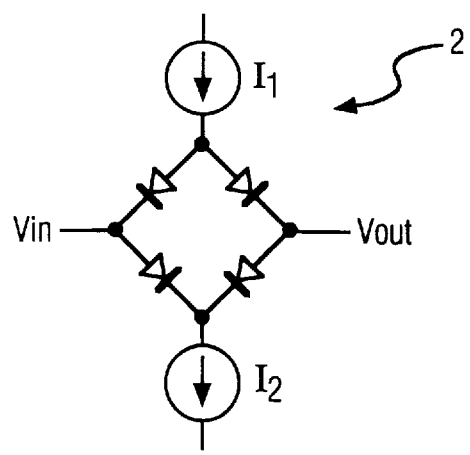
Figure 1C:
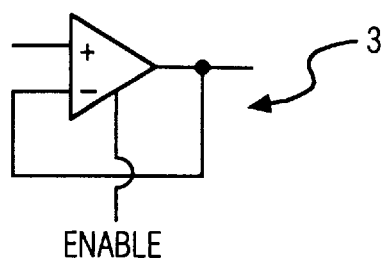
Figure 2:
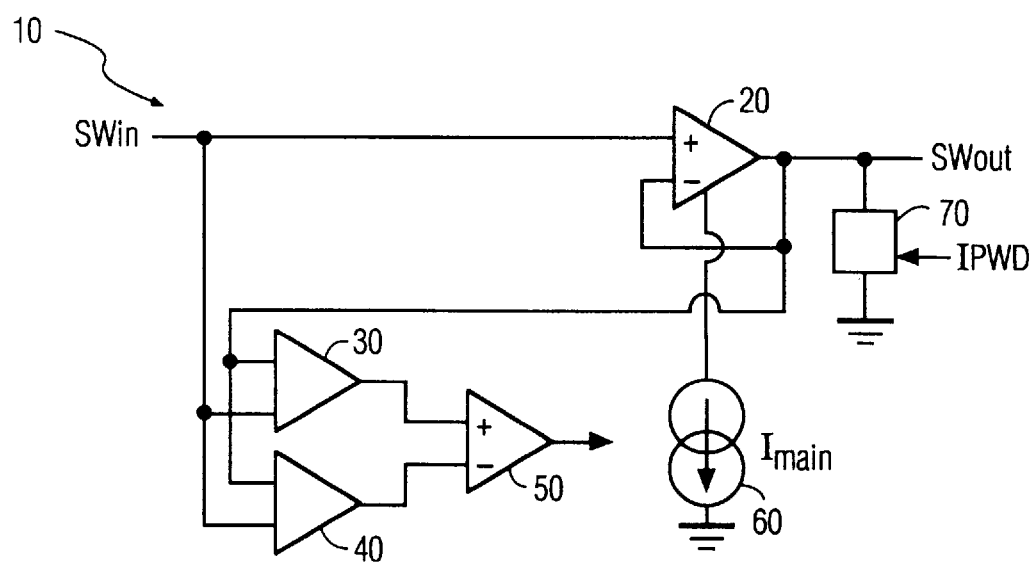
FIG. 2 is a block diagram of the high-speed/high-slew-rate tri-modal all bipolar buffer/switch of the present invention.

In FIG. 2, a high-speed/high-slew-rate tri-modal all bipolar buffer/switch 10 according to the present invention is shown. In the high-speed/high-slew-rate tri-modal all bipolar buffer/switch 10 of the present invention, an input voltage to the switch 10, swin, is received by the non-inverting (+) input of a unity gain operational amplifier 20, which is a conventional unity gain operational amplifier, as well as by a maximum level detector 30 and a minimum level detector 40. The output of switch 10, swout, is output from the unity gain operational amplifier 20, fed back to the inverting (−) input of the unity gain operational amplifier 20, and is a second input to the maximum level detector 30 and the minimum level detector 40. The output of the maximum level detector 30 is input to the non-inverting (+) input to an amplifier 50, which is conventionally implemented, and the output of the minimum level detector 40 is input to the inverting (−) input of the amplifier 50. The output of amplifier 50 controls a current source 60, which is conventionally implemented and which produces current $I_{main}$. Further, the output of the unity gain operational amplifier 20 is coupled to a voltage generator 70, which is conventionally implemented and which generates a constant d.c. voltage when the switch 10 is powered down, thereby holding the output of the switch 10 at a constant d.c. voltage level when the switch 10 is powered down.

The present invention equalizes output voltage, swout, to input voltage, swin, by controlling $I_{main}$ to source or sink as much current as necessary to achieve the above-mentioned function. When input voltage is received by amplifier 20, which is a unity gain operational amplifier having no voltage drop thereacross when the switch 10 is closed, swin is transferred to the output of the amplifier 20 as swout, without: gain or attenuation. Current source 60, which generates $I_{main}$, controls the amplifier 20 to provide a high sink and a high source capability to unity gain operational amplifier 20. Switch 10 of the present invention does not have a fixed amount: of current output, as in the related art in which current is wasted, but controls the output of switch 10 by $I_{main}$ through the feedback of swout from the output of amplifier 20 to the detector 30 and the detector 40. Therefore, the present invention provides either more or less current, depending on the demand thereon.

As shown in FIG. 2, maximum level detector 30 and minimum level detector 40 sense swin and swout. If swin is lower than swout or if swout is lower than swin, then $I_{main}$ is changed by the amplifier 50 to match swout to swin. In an ideal switch, when the switch is closed, the same signal appearing at the input of the switch instantaneously appears at the output of the switch. In the present invention, current source 60 provides a large amount of current, e.g., 5 miliamperes, to almost instantaneously match the voltage level of the output of switch 10 to the voltage level of the input of switch 10, which approaches the above-mentioned characteristics of an ideal switch. Also in the present invention, when the switch 10 is opened, the current source $I_{main}$ is shut-down, making the op-amp 20 high impedance at the output thereof, with minimal leakage current of only a few nano-amperes. Therefore, the switch 10 of the present invention closely approximates the characteristics of an ideal switch.

Unlike a normal switch, which is bi-modal (i.e., open or closed), the switch 10 of the present invention has a third state, called powerdown, in addition to being open or closed. As shown in FIG. 2, voltage generator 70 provides a d.c. reference voltage at the output of unity gain operational amplifier 20 when the switch 10 of the present invention is powered down. When input signal ipwd, which is generated and transmitted by conventional logic control circuits, is received by the voltage generator 70, the voltage generator 70 generates the d.c. reference voltage.

Figure 3:
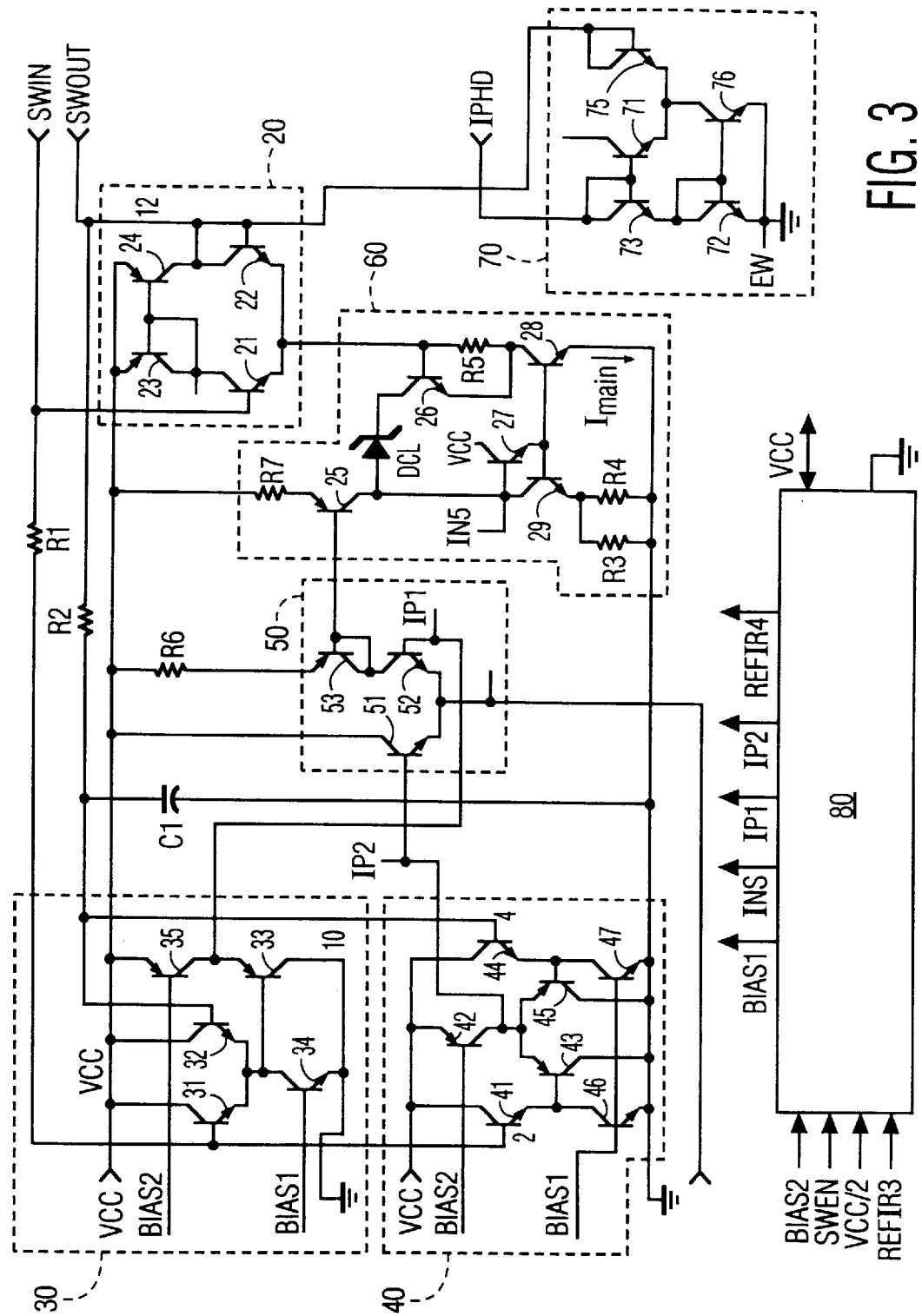
FIG. 3 is a detailed circuit diagram of the switch of the present invention.

Referring now to FIG. 3, npn transistors 21 and 22, and pnp transistors 23 and 24 form the unity gain operational amplifier 20. The emitter of transistor 21 is coupled to the emitter of transistor 22. Further, the emitter of transistor 23 is coupled to the emitter of transistor 24. As shown in FIG. 3, feedback from the output of the amplifier 20 to the inverting terminal (−) of the unity gain operational amplifier 20 is provided between the collector of transistor 24 and the base of transistor 22. The above-mentioned feedback provides for the unity gain of the unity gain operational amplifier 20. Also as shown in FIG. 3, swin is input to the amplifier 20 through the bases of each of transistors 21 and 22. Further, the output of unity gain operational amplifier 20 is the collector of transistor 24.

As shown in FIG. 3, $I_{main}$ is the current output from the emitter of npn transistor 28. $I_{main}$ flows to ground. As shown in FIG. 3, transistors 24 and 28 form a current mirror. In FIG. 3, the output current, which is the current flowing from the collector of transistor 24, is directly proportional to the current flowing from the collector of transistor 28, which current is split between transistors 21 and 22. Therefore, if the amount of current flowing from transistor 24 increases, the amount of current flowing from transistor increases, as well. The current flowing from the collector of transistor 21 through the emitter of transistor 21 is transmitted to the collector of transistor 23 and is mirrored through transistor 24 through the current mirror formed by transistors 23 and 24. Therefore, changing $I_{main}$ changes the output current of switch 10.

Also as shown in FIG. 3, maximum level detector 30 includes npn transistor 31 and npn transistor 32. Further, minimum level detector 40 includes npn transistor 44 and npn transistor 41, which voltages supplied therefrom are level-shifted versions of voltages supplied to pnp transistor 43 and pnp transistor 45.

As shown in FIG. 3, the input to switch 10, swin, is input to transistor 21 in unity gain operational amplifier 20 and, at the same time, through R1, a 30 kilo-ohm resistor, into the base of transistor 31 in maximum level detector 30, and to the base of transistor 41 in minimum level detector 40. Further, the output of switch 10, swout, is fed back to the base of transistor 44 in minimum level detector 40 and the base of transistor 32 in maximum level detector 30.

Operation of the maximum level detector 30 is explained, with reference to FIG. 3. With swout being fed back to transistor 32, and swin being input to transistor 31, transistor 31 and transistor 32 form a differential pair sensing the input and the output of the switch 10. If the input voltage level of swin is greater than the output voltage level swout, the voltage level at the base of transistor 31 is greater than the voltage level at the base of transistor 32. Therefore, transistor 31 is conducting, and transistor 32 is off. As a result, a current flowing into the collector of transistor 34 is only flowing from one of transistor 31 and transistor 32. Therefore, the large voltage (of the voltages at the bases of transistors 31 and 32) will end-up on the emitter of transistor 33, hence a maximum level detector.

Likewise, a similar activity happens in the minimum level detector 40. As shown in FIG. 3, swout is transferred through 30 kilo-ohm resistor R2 to the base of transistor 44. Resistor R2 is also coupled to ground through capacitor C1. Further, swin is transferred through resistor R1 to the base of transistor 41. Both transistor 41 and 44 are conventional emitter-follower transistors. Therefore, swin and swout are applied, respectively, to the bases of pnp transistors 43 and 45 through emitter follower transistors 41 and 44, respectively. Transistors 43 and 45 in minimum level detector 40 act similarly to transistors 31 and 32 in maximum level detector 30. Accordingly, transistors 43 and 45 sense which of swout or swin is lower than the other. If swin is higher than swout, transistor 45 is conducting. If swin is smaller than swout, transistor 43 is conducting. As a result, the emitter voltage of either transistor 43 or 45 will equal the lower value of swin and swout and controls npn transistor 51 in amplifier 50.

As shown above, the maximum level detector 30 and the minimum level detector 40 determine whether swin is higher than swout or whether swout is higher than swin. Regardless of which one is higher, the higher value ends up as a control signal on the base of npn transistor 52 and the lower value ends up as a control signal on the base of npn transistor 51 in the amplifier 50. The output of amplifier 50 eventually controls transistor 28 in the current source 60.

As shown in FIG. 3, transistor 51 and transistor 52 form a differential pair of transistors. Therefore, the control signal, appearing at the bases of transistor 51 and transistor 52 cause a current change in the pnp transistor 53. The current change is then mirrored back to pnp transistor 25, which provides current to npn transistor 29. The current flowing into npn transistor 29 is then mirrored to npn transistor 28. Accordingly, switch 10 of the present invention determines whether swin is greater than swout or whether swin is less than swout. In both cases, the current $I_{main}$ increases to allow more sinking or sourcing capability to the amplifier 20. The resistor R5, transistor 26, and diode D1 combination is normally off. Only if the amplifier 20 load demands more than 10 mili-amperes of current does npn transistor 26 turn on, stealing current from transistor 25 through diode D1, thereby limiting the increase in $I_{main}$. If swout is equal to swin, neither maximum level detector 30 nor minimum level detector 40 demands current and transistor 28 is running at a low bias current.

Also as shown in FIG. 3, voltage generator 70 provides a reference d.c. voltage when switch 10 is powered down. Voltage generator 70 is conventionally implemented using bipolar devices. As shown in FIG. 3, switch enable (swen) opens or closes the switch 10. Swen is input to switch logic 80, which is conventionally implemented. In the switch logic 80, in addition to conventional logic controls, the bias currents for the switch 10 as a whole are generated. When the foregoing outputs are activated, switch 10 is opened because transistor 28, which generates $I_{main}$, is powered down. Therefore, no current will be available for biasing switch 10, hence making the amplifier 20 high impedance, like an open switch.

Voltage generator 70 of the present invention provides a reference d.c. voltage to swout when switch 10 is powered down. The reference d.c. voltage equals 1.4 volts. Ipwd is a current generated elsewhere in the circuit when the switch is powered down. Ipwd is input to the collector and base of npn transistor 73, then to the collector and base of npn transistor 72, which are both configured as diodes. As the current from ipwd flows through transistor 73 and transistor 72 to ground, a voltage drop of $2V_{be}$, which is approximately equal to 1.4 volts, develops at the base of transistor 73. The current mirror made of npn transistors 72 and 76 is activated, providing bias current for the differential amplifier made up of npn transistors 71 and 75. The collector of transistor 71 is connected to the collector of transistor 23. The collector and base of npn transistor 75 are shorted together and connected to swout. Although the unity gain amplifier 20 is powered down, transistors 71, 75, 23 and 24 are active and produce a new unity gain connected op-amp which drives the switch 10 output with a Vref of approximately 1.4 volts.

The present invention is not limited to the embodiments, described above, but also encompasses variations thereof.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A tri-modal switch coupled to a load, said tri-modal switch receiving an input voltage and outputting an output voltage, said tri-modal switch comprising:

a unity-gain operational amplifier, coupled to the load, for receiving the input voltage, for outputting the output voltage equal to the input voltage, and for outputting an output current; and current means operatively coupled to said unity-gain operational amplifier for providing said output current to said unity-gain operational amplifier, wherein an amount of said output current of said unity-gain operational amplifier is sourced to the load or sunk from the load by said unity-gain operational amplifier dependent upon said output current of said current means.

2. The tri-modal switch according to claim 1, further comprising a voltage generator, coupled to said unity-gain operational amplifier, for generating a d.c. voltage at the output of the unity gain amplifier when said unity-gain operational amplifier is powered down.

3. A tri-modal all bipolar device switch receiving an input voltage and outputting an output voltage, said tri-modal switch comprising:

a unity-gain operational amplifier for receiving the input voltage and for outputting the output voltage equal to the input voltage;

current means for supplying current to said unity-gain operational amplifier when the output voltage is greater than the input voltage and when the output voltage is less than the input voltage; and a voltage generator, coupled to said unity-gain operational amplifier, for generating a d.c. voltage when said unity-gain operational amplifier is powered down.

4. A tri-modal switch receiving an input voltage and outputting an output voltage, said tri-modal switch comprising:

a unity-gain operational amplifier having an input and an output and receiving the input voltage and outputting the output voltage equal to the input voltage;

a maximum level detector, coupled to said unity-gain operational amplifier, for receiving the output voltage of said unity-gain operational amplifier and the input voltage, for determining which one of the input voltage and the output voltage is greater, and for generating and outputting a maximum level detector control signal equal to the greater of the output voltage and the input voltage;

a minimum level detector, coupled to said unity-gain operational amplifier, for receiving the output voltage of said unity-gain operational amplifier and the input voltage, for determining which one of the input voltage and the output voltage is lesser, and for generating and outputting a minimum level detector control signal equal to the lesser of the output voltage and the input voltage;

an amplifier, coupled to said maximum level detector and to said minimum level detector, said amplifier having a non-inverting input and an inverting input and receiving the maximum level detector control signal at said non-inverting input and the minimum level detector control signal at said inverting input, and outputting a current generator control signal based thereon;

a current generator, coupled to said unity-gain operational amplifier and to said amplifier, for decreasing output current from said unity-gain operational amplifier when the output voltage is greater than the input voltage and for increasing said output current from said unity-gain operational amplifier when the output voltage is less than the input voltage, based on said current generator control signal; and a voltage generator, coupled to said unity-gain operational amplifier, for generating a d.c. voltage when said unity-gain operational amplifier is powered down.

5. A tri-modal switch receiving an input voltage and outputting an output voltage, said tri-modal switch comprising:

a unity-gain operational amplifier having an input and an output and receiving the input voltage and outputting the output voltage equal to the input voltage; and current means for decreasing output current from said unity-gain operational amplifier when the output voltage is greater than the input voltage and for increasing said output current from said unity-gain operational amplifier when the output voltage is less than the input voltage.

6. A tri-modal switch coupled to a load, said tri-modal switch receiving an input voltage and outputting an output voltage, said tri-modal switch comprising:

a unity-gain operational amplifier, coupled to the load for receiving the input voltage, for outputting the output voltage equal to the input voltage, and for outputting an output current; and current means for providing said output current to said unity-gain operational amplifier, wherein an amount of said output current of said unity-gain operational amplifier is sourced to the load or sunk from the load by said unity-gain operational amplifier dependent upon said output current of said current means, said current means comprising:

detector means, coupled to said unity-gain operational amplifier, for receiving the input voltage and the output voltage, for determining whether the input voltage is greater than the output voltage and whether the input voltage is less than or equal to the output voltage, and for outputting a control signal based on the determination; and a current source, coupled to said detector means and to said unity-gain operational amplifier, for generating a current applied to said unity-gain operational amplifier based on said control signal.

7. The tri-modal switch according to claim 6, further comprising a voltage generator, coupled to said unity-gain operational amplifier, for generating a d.c. voltage when said unity-gain operational amplifier is powered down.

* * * * *